(12) United States Patent
Liu et al.

(10) Patent No.: US 10,964,907 B2
(45) Date of Patent: Mar. 30, 2021

(54) DISPLAY PANEL, MANUFACTURING METHOD THEREOF AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Jianfeng Liu, Beijing (CN); Ni Yang, Beijing (CN); Zhongfei Dong, Beijing (CN); Zhijian Qi, Beijing (CN); Yunze Li, Beijing (CN); Xin Liu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 94 days.

(21) Appl. No.: 16/221,927

(22) Filed: Dec. 17, 2018

(65) Prior Publication Data

US 2019/0267568 A1 Aug. 29, 2019

(30) Foreign Application Priority Data

Feb. 24, 2018 (CN) .......................... 201810156768.6

(51) Int. Cl.
*H01L 51/52* (2006.01)
*H01L 27/32* (2006.01)
(Continued)

(52) U.S. Cl.
CPC ...... *H01L 51/5237* (2013.01); *H01L 27/3244* (2013.01); *H01L 51/0002* (2013.01); *H01L 51/56* (2013.01)

(58) Field of Classification Search
CPC ......... H01L 51/00; H01L 51/52; H01L 51/56; H01L 51/0097; H01L 51/0002;
(Continued)

(56) References Cited

U.S. PATENT DOCUMENTS

2008/0079359 A1 * 4/2008 Sakakura ............ H01L 27/1259
313/504
2011/0309384 A1 * 12/2011 Ito .......................... H01L 33/505
257/88
(Continued)

FOREIGN PATENT DOCUMENTS

| CN | 105934338 A | 9/2016 |
|---|---|---|
| CN | 106816549 A | 6/2017 |

OTHER PUBLICATIONS

First Office Action for Chinese Application No. 201810156768.6, dated May 17, 2019, 5 Pages.

*Primary Examiner* — Chuong A Luu
(74) *Attorney, Agent, or Firm* — Brooks Kushman P.C.

(57) ABSTRACT

The present disclosure relates to the field of display technology, in particular to a display panel, a manufacturing method thereof, and a display device. The display panel includes a display substrate and an encapsulation layer for encapsulating the display substrate. The encapsulation layer includes at least one inorganic composite film layer, and each inorganic composite film layer includes an inorganic matrix and an inorganic filler. The inorganic matrix includes a plurality of grains spaced apart by gaps, and the inorganic filler is capable of enclosing each grain and being filled in a gap between every two adjacent grains.

6 Claims, 2 Drawing Sheets

(51) Int. Cl.
*H01L 51/00* (2006.01)
*H01L 51/56* (2006.01)

(58) Field of Classification Search
CPC . H01L 51/5237; H01L 51/5253; H01L 51/50; H01L 2251/5238; H01L 27/32; H01L 27/15; H01L 27/156; H01L 27/3244; H01L 27/1214; H01L 27/1296; H01L 27/3279; H01L 27/3267; H01L 27/3293; H01L 27/3286; H01L 27/3241; H01L 27/3281; H01L 27/3237; G02F 1/13; G02F 2001/13793; B32B 2457/202; H05K 2201/10136
USPC .............................................. 438/22, 48, 54
See application file for complete search history.

(56) References Cited

U.S. PATENT DOCUMENTS

| | | | |
|---|---|---|---|
| 2013/0056714 A1* | 3/2013 | Hasegawa | H01L 27/3276 257/40 |
| 2015/0207095 A1 | 7/2015 | Mun et al. | |
| 2018/0166653 A1 | 6/2018 | Xie et al. | |

\* cited by examiner

DISPLAY PANEL, MANUFACTURING METHOD THEREOF AND DISPLAY DEVICE

CROSS-REFERENCE TO RELATED APPLICATION

This application claims priority to Chinese Patent Application No. 201810156768.6 filed on Feb. 24, 2018, which is incorporated herein by reference in its entirety.

TECHNICAL FIELD

The present disclosure relates to the field of display technology, in particular to a display panel, a manufacturing method thereof and a display device.

BACKGROUND

In the field of display technology, an Organic Light-Emitting Diode (OLED) display technology becomes a popular display technology having the most potential due to such advantages as self-luminescence, simple structure, being ultrathin and ultralight, rapid response, wide viewing angle, low power consumption and the capability of flexible display. Currently, an OLED device is mainly encapsulated through Thin Film Encapsulation (TFE), rather than in a conventional way where a glass cover plate is adopted, due to its flexible display function.

SUMMARY

In one aspect, the present disclosure provides in some embodiments a display panel, including a display substrate and an encapsulation layer for encapsulating the display substrate. The encapsulation layer includes at least one inorganic composite film layer, and each inorganic composite film layer includes an inorganic matrix and an inorganic filler. The inorganic matrix includes a plurality of grains spaced apart by gaps, and the inorganic filler encloses each grain and fills in the gaps.

In a possible embodiment of the present disclosure, the inorganic filler is glass powder.

In a possible embodiment of the present disclosure, the glass powder includes 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$.

In a possible embodiment of the present disclosure, the inorganic matrix of the inorganic composite film layer includes at least one of $SiN_x$ and $SiO_x$.

In a possible embodiment of the present disclosure, the encapsulation layer further includes a plurality of organic film layers and a plurality of inorganic composite film layers superimposed and arranged alternately.

In another aspect, the present disclosure provides in some embodiments a method for manufacturing a display panel, including: providing a display substrate; and forming an encapsulation layer covering the display substrate, the encapsulation layer including at least one inorganic composite film layer. The step of forming the encapsulation layer covering the display substrate includes: forming an inorganic matrix including a plurality of grains spaced apart by gaps; and spraying a slurry onto the inorganic matrix, and heating the slurry after the slurry has gradually permeated into the inorganic matrix, so as to remove a solvent in the slurry, and form an inorganic filler enclosing each grain and filling in the gaps, thereby to form the inorganic composite film layer through the inorganic matrix and the inorganic filler.

In a possible embodiment of the present disclosure, the step of forming the encapsulation layer covering the display substrate further includes: forming an inorganic matrix of an inorganic composite film layer; and spraying a glass slurry prepared through a sol-gel process onto the inorganic matrix, and heating the glass slurry after the glass slurry has gradually permeated into the inorganic matrix, so as to remove a solvent in the glass slurry and form glass powder enclosing each grain and filling in the grain boundaries, thereby to form the inorganic composite film layer through the inorganic matrix and the glass powder.

In a possible embodiment of the present disclosure, the glass powder includes 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$.

In a possible embodiment of the present disclosure, the solvent includes a first solvent and a second solvent. The sol-gel process includes: calculating an amount of each of a calcium-containing compound, a magnesium-containing compound, a barium-containing compound, a boron-containing compound, an aluminium-containing compound, and a silicon-containing compound on the basis of chemical components of the glass powder; and dissolving the calcium-containing compound, the magnesium-containing compound, the barium-containing compound, the boron-containing compound, the aluminium-containing compound and the silicon-containing compound, each at the calculated amount, in the first solvent, so as to form a sol; and adding the second solvent into the sol, so as to form the glass slurry in a gel state.

In a possible embodiment of the present disclosure, the calcium-containing compound is calcium nitrate, the magnesium-containing compound is magnesium nitrate or magnesium sulfate, the barium-containing compound is barium acetate or barium nitrate, the boron-containing compound is boric acid, the aluminium-containing compound is aluminium nitrate or aluminium sulfate, the silicon-containing compound is ethyl silicate, the first solvent is glacial acetic acid or alcohol, and the second solvent is diethylenetriamine.

In a possible embodiment of the present disclosure, the slurry is heated at a temperature ranged from 280 to 340° C.

In a possible embodiment of the present disclosure, the encapsulation layer further includes a plurality of organic film layers and a plurality of inorganic composite film layers. The step of forming the encapsulation layer covering the display substrate further includes forming the organic film layers and the inorganic composite film layers alternately.

In yet another aspect, the present disclosure provides in some embodiments a display device including the above-mentioned display panel.

DETAILED DESCRIPTION

The present disclosure will be described hereinafter in conjunction with the drawings and embodiments. The following embodiments are for illustrative purposes only, but shall not be used to limit the scope of the present disclosure.

Barix, as a promising encapsulation technology, is a multi-layered thin film encapsulation technology, and a Barix encapsulation layer provides enhanced water vapor barrier property by a plurality of organic and inorganic layers (typically seven layers) deposited alternately.

In the related art, during the manufacture of the inorganic layer, due to existence of intrinsic cohesive stress, pin holes are formed at a grain boundary, i.e., gaps between every two adjacent grains. The pin holes provide paths for water vapor transmission, resulting in a reduced service life of the device. In addition, in order to ensure a sufficiently low Water Vapor Transmission Rate (WVTR), the quantity of composite layers may increase inevitably. With more composite layers, more transition processing in different chambers will be needed. As a result, the manufacture cost may increase and the production efficiency may be adversely affected.

An object of the present disclosure is to provide a display panel, a manufacturing method thereof and a display device. In the encapsulation layer of the display panel, an inorganic composite film layer has an increased density and reduced WVTR thereby to reduce the quantity of the film layers in the encapsulation layer, and improve the production efficiency.

Figure 1:
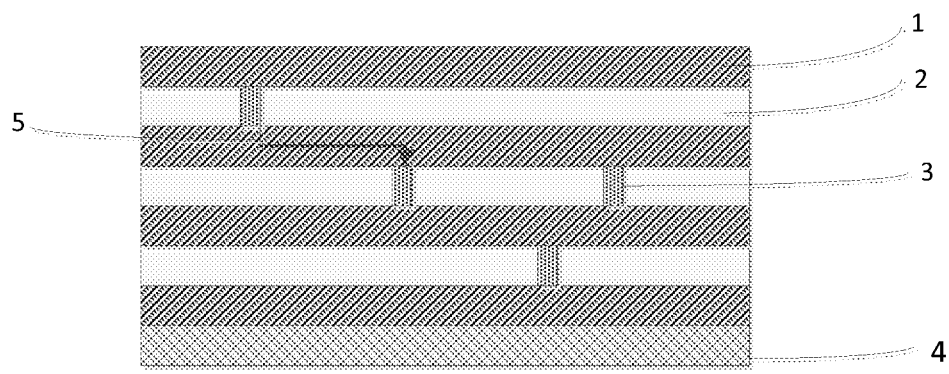
FIG. 1 is a sectional view of a conventional display panel.

FIG. 1 is a sectional view of a conventional display panel, where 1 represents an organic film layer, 2 represents an inorganic film layer, 3 represents a gap in the inorganic film layer, 4 represents a display substrate, and 5 represents an equivalent path for water vapor transmission. Due to the existence of the transmission paths and the large amount of the gaps, the equivalent path is relatively short when the water vapor passes through an upper organic film layer to a lower organic film layer.

Figure 2:
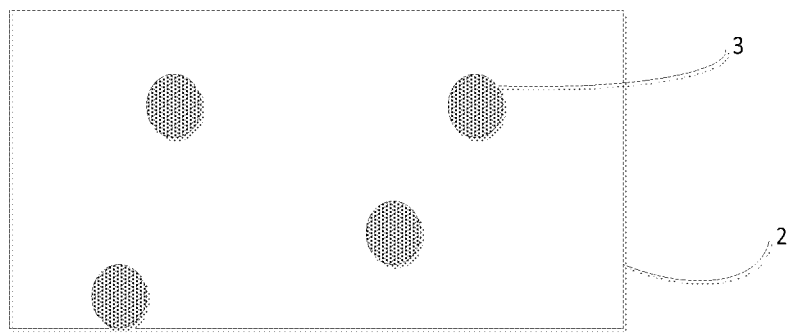
FIG. 2 is a top view of an inorganic film layer in a conventional encapsulation layer.

FIG. 2 is a top view of the inorganic film layer in a conventional encapsulation layer, where 2 represents the inorganic film layer, and 3 represents the gap in the inorganic film layer. Due to the existence of the intrinsic cohesive stress, it is impossible to form the inorganic film layer in an ideal fully-dense state, leaving gaps formed at the grain boundary of the film layer, which provides paths for water vapor transmission. Hence, an encapsulation effect may be adversely affected, and a service life of the device may be reduced.

In view of above problems, the present disclosure provides in some embodiments a display panel, including a display substrate and an encapsulation layer for encapsulating the display substrate. The encapsulation layer includes at least one inorganic composite film layer, and each inorganic composite film layer includes an inorganic matrix and inorganic filler. The inorganic matrix includes a plurality of grains spaced apart by gaps, and the inorganic filler encloses each grain and filling in the gaps.

Figure 3:
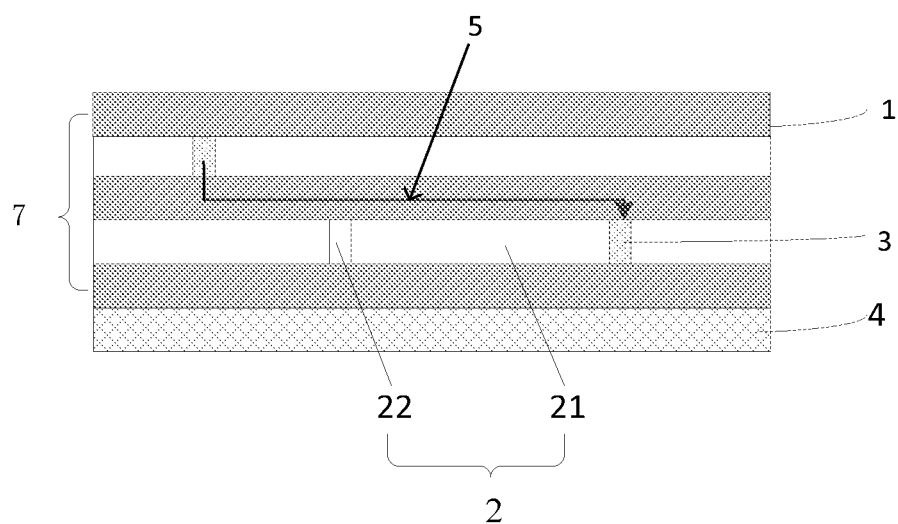
FIG. 3 is a sectional view of a display panel according to some embodiments of the present disclosure.
Figure 4:
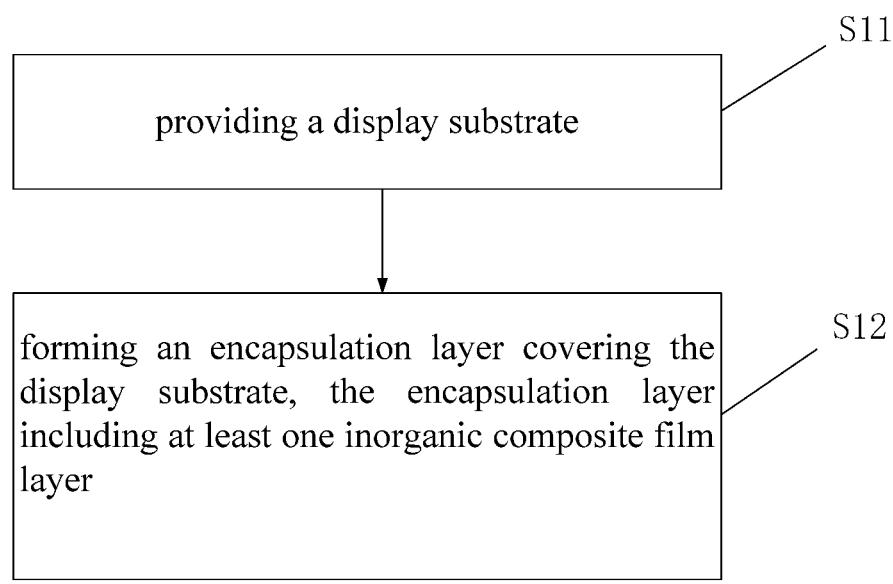
FIG. 4 is a flow chart of a method for manufacturing the display panel according to some embodiments of the present disclosure.

As shown in FIG. 3, the display panel includes the display substrate 4 and the encapsulation layer 7 for encapsulating the display substrate 4. The encapsulation layer 7 includes at least one inorganic composite film layer 2, and each inorganic composite film layer 2 includes the inorganic matrix 21 and the inorganic filler 22. The inorganic matrix 21 includes a plurality of grains spaced apart by gaps, and the inorganic filler 22 encloses each grain and filling in the gaps.

In some embodiments of the present disclosure, the inorganic filler 22 may fully permeate into the inorganic matrix 21, so as to enclose the grains in the inorganic matrix 21 to form a shell-core structure. The inorganic filler 22 is located at a grain boundary for reducing an intrinsic cohesive stress and filling in the gaps at the grain boundary, thereby to improve the density of the inorganic composite film layer.

The inorganic filler 22 may be a nano-scale inorganic filler having a particle size of 1 to 100 nm. In some embodiments of the present disclosure, the inorganic filler may be glass powder having a particle size of 1 to 100 nm. To be specific, the glass powder may include 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$. In some embodiments of the present disclosure, the glass powder may include 5 to 25 mol % of CaO, 5 to 25 mol % of MgO, 5 to 25 mol % of BaO, 10 to 50 mol % of $B_2O_3$, 5 to 30 mol % of $Al_2O_3$, and 10 to 60 mol % of $SiO_2$.

During the formation, the glass powder is in an amorphous state so as to fill in parts of the gaps in the inorganic matrix, form a dense film layer, prolong the equivalent path for water vapor transmission, thereby to improve the water vapor barrier property of the inorganic composite film layer 2.

The inorganic matrix 21 of the inorganic composite film layer 2 may include at least one of $SiN_x$ and $SiO_x$.

The encapsulation layer 7 may further include organic film layers 1. The organic film layers 1 and the inorganic composite film layers 2 are superimposed and arranged alternately.

Each organic film layer 1 may be made of a high-temperature resistance material e.g., polyimide (PI) or polyphenylene terephthamide. PI exhibits excellent high-temperature mechanical performance, wear-resistant performance, radiation-resistant performance and fire-resistant performance after it is heated at a temperature of 315° C. for 1000 hours, and it is capable of being subjected to treatment at a temperature of 482° C. for a short time period.

Polyphenylene terephthamide may be used continuously at a temperature of −196° C. to 204° C., and it may not be degraded and melt at a temperature of 560° C., therefore it is widely used in aerospace engineering, civil engineering, ground transportation, and engineering plastics.

In a possible embodiment of the present disclosure, the encapsulation layer 7 may include at least three organic film layers and at least two inorganic composite film layers. With an increased amount of the organic film layers and the inorganic composite film layers, it is also able to reduce the WVTR of the encapsulation layer. For example, the encapsulation layer may include four organic film layers and three inorganic composite film layers.

As compared with the related art, the display panel in the embodiments of the present disclosure includes the display substrate and the encapsulation layer, and the encapsulation layer includes at least one inorganic composite film layer. Each inorganic composite film layer includes the inorganic matrix and the inorganic filler. The inorganic matrix includes the plurality of grains spaced apart by gaps, and the inorganic filler encloses each grain and filling in the gaps.

According to the embodiments of the present disclosure, the inorganic filler fully permeates into the inorganic matrix, so as to enclose the grains in the inorganic matrix, thereby to form the shell-core structure. The inorganic filler is located at the grain boundary for reducing the intrinsic cohesive stress and filling in the gaps at the grain boundary, thereby to reduce the WVTR of the inorganic composite film layer as well as the quantity of the film layers in the encapsulation layer, and improve the production efficiency.

The present disclosure further provides in some embodiments a method for manufacturing a display device, which includes: Step S11 of providing a display substrate; and Step S12 of forming an encapsulation layer covering the display substrate, the encapsulation layer including at least one inorganic composite film layer. The step of forming the inorganic composite film layer includes: forming an inorganic matrix including a plurality of grains spaced apart by gaps; and spraying a slurry onto the inorganic matrix, and heating the slurry after the slurry has gradually permeated into the inorganic matrix, so as to remove a solvent in the slurry, and form an inorganic filler enclosing each grain and filling in the gaps, thereby to form the inorganic composite film layer through the inorganic matrix and the inorganic filler.

In a possible embodiment of the present disclosure, the encapsulation layer further includes organic film layers, and the forming the encapsulation layer includes forming the organic film layers and the inorganic composite film layers alternately.

The step of forming the encapsulation layer will be described hereinafter in more details.

Step S1: forming an organic film layer.

A method for forming the organic film layer will not be particularly defined herein. The organic film layer may be made of a high-temperature resistance material, e.g., PI or polyphenylene terephthamide.

Step S2: forming the inorganic matrix on the organic film layer, the inorganic matrix including the plurality of grains spaced apart by gaps, and the inorganic matrix of the inorganic composite film layer being made of at least one of $SiN_x$ and $SiO_x$; and spraying a slurry onto the inorganic matrix, and heating the slurry after the slurry has gradually permeated into the inorganic matrix, so as to remove a solvent in the slurry, and form the inorganic filler enclosing each grain and filling in the gaps, thereby to form the inorganic composite film layer through the inorganic matrix and the inorganic filler.

In some embodiments of the present disclosure, Step S2 may include: forming the inorganic matrix on the organic film layer, the inorganic matrix including the plurality of grains spaced apart by gaps, and the inorganic matrix of the inorganic composite film layer being made of at least one of $SiN_x$ and $SiO_x$; and spraying a glass slurry prepared through a sol-gel process onto the inorganic matrix, and heating the glass slurry after the glass slurry has gradually permeated into the inorganic matrix, so as to remove a solvent in the glass slurry and form glass powder enclosing each grain and filling in the grain boundary, thereby to form the inorganic composite film layer through the inorganic matrix and the glass powder.

In a possible embodiment of the present disclosure, the glass powder may include 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$. For example, the glass powder may include 5 to 25 mol % of CaO, 5 to 25 mol % of MgO, 5 to 25 mol % of BaO, 10 to 50 mol % of $B_2O_3$, 5 to 30 mol % of $Al_2O_3$, and 10 to 60 mol % of $SiO_2$.

In a possible embodiment of the present disclosure, the sol-gel process may include: calculating an amount of each of a calcium-containing compound, a magnesium-containing compound, a barium-containing compound, a boron-containing compound, an aluminium-containing compound, and a silicon-containing compound on the basis of chemical components of the glass powder; and dissolving the calcium-containing compound, the magnesium-containing compound, the barium-containing compound, the boron-containing compound, the aluminium-containing compound and the silicon-containing compound, each at the calculated amount, in a first solvent, so as to form a sol; and adding a second solvent into the sol, so as to form the glass slurry in a gel state.

In some embodiments of the present disclosure, the calcium-containing compound may be calcium nitrate, the magnesium-containing compound may be magnesium nitrate or magnesium sulfate, the barium-containing compound may be barium acetate or barium nitrate, the boron-containing compound may be boric acid, the aluminium-containing compound may be aluminium nitrate or aluminium sulfate, and the silicon-containing compound may be ethyl silicate.

In some embodiments of the present disclosure, the first solvent may be glacial acetic acid or alcohol. The calcium-containing compound, the magnesium-containing compound, the barium-containing compound, the boron-containing compound, the aluminium-containing compound and the silicon-containing compound may be dissolved in the first solvent so as to form the sol. In a possible embodiment of the present disclosure, the calcium-containing compound, the magnesium-containing compound, the barium-containing compound, the boron-containing compound, the aluminium-containing compound and the silicon-containing compound may each be dissolved in the first solvent, and then the resultant solutions will be mixed in a certain order, so as to acquire the sol.

In a possible embodiment of the present disclosure, the second solvent may be diethylenetriamine. After the second solvent is added into the sol, the sol will be gradually converted into the glass slurry in the gel state.

The glass slurry may be prepared at a normal temperature conveniently. In addition, the resultant glass slurry is capable of permeating into the inorganic matrix, so as to enclose the grains and fill in the gaps at the grain boundary.

The glass slurry prepared through the sol-gel process may be sprayed onto the inorganic matrix through inkjet printing. The slurry in an amorphous state may cover and flow on a surface of the inorganic matrix, and then gradually permeate into the inorganic matrix, so as to enclose the grains and fill in the gaps at the grain boundary. Then, the slurry may be heated at a temperature ranged from 280 to 340° C., so as to remove the solvent in the slurry by volatilization, thereby to form the glass powder enclosing the grains and fill in the gaps at the grain boundary. The inorganic matrix and the glass powder together form the inorganic composite film layer.

Step S3: forming another organic film layer on the inorganic composite film layer. The method for forming the organic film layer will not be particularly defined herein. The organic film layer may be made of a high-temperature resistance material, e.g., PI or polyphenylene terephthamide.

The quantity of the inorganic composite film layers and the organic film layers may be adjusted in accordance with the practical need. In a possible embodiment of the present disclosure, Steps S2 and S3 may be performed repeatedly, so as to form at least three organic film layers and at least two inorganic composite film layers. The organic film layers and the inorganic composite film layers may be superimposed and arranged alternately.

As compared with the related art, the display panel in the embodiments of the present disclosure includes the display substrate and the encapsulation layer, and the encapsulation layer includes at least one inorganic composite film layer. Each inorganic composite film layer includes the inorganic matrix and the inorganic filler. The inorganic matrix includes the plurality of grains spaced apart by gaps, and the inorganic filler is capable of enclosing each grain and filling in the gaps.

According to the embodiments of the present disclosure, the inorganic filler fully permeates into the inorganic matrix, so as to enclose the grains in the inorganic matrix, thereby to form the shell-core structure. The inorganic filler is located at the grain boundary for reducing the intrinsic cohesive stress and filling in the gaps at the grain boundary, thereby to reduce the WVTR of the inorganic composite film layer as well as the quantity of the film layers in the encapsulation layer, and improve the production efficiency.

The present disclosure further provides in some embodiments a display device including the above-mentioned display panel.

For better understanding of the present disclosure, the display panel, the manufacturing method and the display device will be described hereinafter in more details in conjunction with the embodiments. The present disclosure is not limited to the embodiments.

In some embodiments of the present disclosure, the method for manufacturing the display panel may include the following steps.

Step S1: forming an organic film layer.

Step S2: forming a $SiN_x$ matrix on the organic film layer.

A glass sol containing 12 mol % of BaO, 16 mol % of $B_2O_3$, 9 mol % of $Al_2O_3$ and 63 of mol % $SiO_2$ may be prepared at first. To be specific, high-activity precursors for a target product, e.g., barium acetate, boric acid, aluminium nitrate nonahydrate and ethyl silicate may each be dissolved in a corresponding organic solvent, e.g., glacial acetic acid or alcohol, and the resultant solutions may be mixed in a certain order so as to form the sol. Next, diethylenetriamine may be added into the sol, so as to form the gel. Then, the gel may be uniformly sprayed onto a surface of the inorganic matrix, and heated at a temperature ranged from 280 to 340° C., so as to remove the solvent. At this time, the glass slurry in the amorphous state fills in the gaps at the grain boundary, so as to acquire the inorganic composite film layer.

Step S3: forming another organic film layer on the inorganic composite film layer.

Steps S2 and S3 may be performed repeatedly, so as to form at least three organic film layers and at least two inorganic film layers. Each inorganic composite film layer may be arranged between two adjacent organic film layers.

In another possible embodiment of the present disclosure, the method for manufacturing the display panel may include the following steps.

Step S1: forming one of the organic film layers.

Step S2: forming a $SiN_x$ matrix on the organic film layer.

A glass sol containing 8 mol % of CaO, 8 mol % of MgO, 17 mol % of $Al_2O_3$ and 67 mol % of $SiO_2$ may be prepared at first. To be specific, high-activity precursors for a target product, e.g., calcium nitrate tetrahydrate, magnesium nitrate hexahydrate, aluminium nitrate nonahydrate and ethyl silicate may each be dissolved in a corresponding organic solvent, e.g., glacial acetic acid or alcohol, and the resultant solutions may be mixed in a certain order so as to form the sol. Next, diethylenetriamine may be added into the sol, so as to form the gel. Then, the gel may be uniformly sprayed onto a surface of the inorganic matrix, and heated at a temperature ranged from 280 to 340° C., so as to remove the solvent. At this time, the glass slurry in the amorphous state fills in the gaps at the grain boundary, so as to acquire the inorganic composite film layer.

Step S3: forming another organic film layer on the inorganic composite film layer.

Steps S2 and S3 may be performed repeatedly, so as to form at least three organic film layers and at least two inorganic film layers. Each inorganic composite film layer may be arranged between two adjacent organic film layers.

For the glass slurry containing 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$, the high-activity precursors and the solvents are not limited to those mentioned above, and any other appropriate high-activity precursors and solvents may also be applied.

As compared with the related art, the display device in the embodiments of the present disclosure includes the display panel, the display panel includes the display substrate and the encapsulation layer, and the encapsulation layer includes at least one inorganic composite film layer. Each inorganic composite film layer includes the inorganic matrix and the inorganic filler. The inorganic matrix includes the plurality of grains spaced apart by gaps, and the inorganic filler encloses each grain and fills in the gaps.

According to the embodiments of the present disclosure, the inorganic filler fully permeates into the inorganic matrix, so as to enclose the grains in the inorganic matrix, thereby to form the shell-core structure. The inorganic filler is located at the grain boundary for reducing the intrinsic cohesive stress and fill in the gaps at the grain boundary, thereby to enhance the density of the composite film layer, reduce the WVTR of the inorganic composite film layer as well as the quantity of the film layers in the encapsulation layer, and improve the production efficiency.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a display panel, comprising:
    providing a display substrate; and
    forming an encapsulation layer covering the display substrate, the encapsulation layer comprising at least one inorganic composite film layer,
    wherein the step of forming the encapsulation layer covering the display substrate comprises:
    forming an inorganic matrix comprising a plurality of grains spaced apart by gaps; and
    spraying a slurry onto the inorganic matrix, and heating the slurry after the slurry has gradually permeated into the inorganic matrix, so as to remove a solvent in the slurry, and form an inorganic filler enclosing each grain and filling in the gaps, thereby to form the inorganic composite film layers through the inorganic matrix and the inorganic filler;
    wherein the encapsulation layer further comprises a pluralilty of organic film layers and a plurality of inorganic composite film layers, and the step of forming the encapsulation layer covering the display substrate futher comprises forming the organic film layers and the inorganic composite film layers alternately.

2. The method according to claim 1, wherein the step of forming the encapsulation layer covering the display substrate further comprises:

forming an inorganic matrix of an inorganic composite film layer; and spraying a glass slurry prepared through a sol-gel process onto the inorganic matrix, and heating the glass slurry after the glass slurry has gradually permeated into the inorganic matrix, so as to remove a solvent in the glass slurry and form glass powder enclosing each grain and filling in grain boundaries, thereby to form the inorganic composite film layer through the inorganic matrix and the glass powder.

3. The method according to claim 2, wherein the glass powder comprises 0 to 30 mol % of CaO, 0 to 30 mol % of MgO, 0 to 30 mol % of BaO, 0 to 60 mol % of $B_2O_3$, 5 to 30 mol % of $Al_2O_3$, and 10 to 80 mol % of $SiO_2$.

4. The method according to claim 3, wherein the solvent comprises a first solvent and a second solvent, wherein the sol-gel process comprises:

calculating an amount of each of a calcium-containing compound, a magnesium-containing compound, a barium-containing compound, a boron-containing compound, an aluminium-containing compound, and a silicon-containing compound on the basis of chemical components of the glass powder;

dissolving the calcium-containing compound, the magnesium-containing compound, the barium-containing compound, the boron-containing compound, the aluminium-containing compound and the silicon-containing compound, each at the calculated amount, in the first solvent, so as to form a sol; and adding the second solvent into the sol, so as to form the glass slurry in a gel state.

5. The method according to claim 4, wherein the calcium-containing compound is calcium nitrate, the magnesium-containing compound is magnesium nitrate or magnesium sulfate, the barium-containing compound is barium acetate or barium nitrate, the boron-containing compound is boric acid, the aluminium-containing compound is aluminium nitrate or aluminium sulfate, the silicon-containing compound is ethyl silicate, the first solvent is glacial acetic acid or alcohol, and the second solvent is diethylenetriamine.

6. The method according to claim 1, wherein the slurry is heated at a temperature ranged from 280 to 340° C.

* * * * *